United States Patent
Kimura et al.

(10) Patent No.: US 6,901,305 B2
(45) Date of Patent: May 31, 2005

(54) BONDING DATA SETTING DEVICE AND METHOD

(75) Inventors: Kazumasa Kimura, Nishitama-gun (JP); Hitoshi Watanabe, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 396 days.

(21) Appl. No.: 10/026,255

(22) Filed: Dec. 21, 2001

(65) Prior Publication Data

US 2002/0079348 A1 Jun. 27, 2002

(30) Foreign Application Priority Data

Dec. 22, 2000 (JP) .................................... 2000-390835

(51) Int. Cl.⁷ .............................................. G06F 19/00
(52) U.S. Cl. ...................... 700/121; 700/180; 345/645
(58) Field of Search ........................... 700/121, 95, 109, 700/117, 160, 173; 345/964, 619, 581, 625, 661–662, 663, 666, 645

(56) References Cited

U.S. PATENT DOCUMENTS 5,483,626 A * 1/1996 Nakayama ................... 345/645
6,564,115 B1 * 5/2003 Kinnaird ...................... 700/121

* cited by examiner

*Primary Examiner*—Leo Picard
*Assistant Examiner*—Sheela Rao
(74) *Attorney, Agent, or Firm*—Koda & Androlia

(57) ABSTRACT

For facilitating and making more efficient the setting of the operating parameters of a bonding tool that is used to form a wire loop into a desired shape, when an editing handle is dragged, the loop shape of a wire loop line drawing displayed on a display screen is redrawn as a secondary loop line drawing. The values of the operating parameters corresponding to the loop shape of the drawn or redrawn secondary loop line drawing are calculated, and the results are displayed in a parameter list.

8 Claims, 9 Drawing Sheets

FIG. 6

PARAMETER SETTING RANGE

| PARAMETER ITEM | SETTING RANGE |
|---|---|
| REVERSE MODE | NO, SLOW, FAST |
| LOOP HEIGHT | 0000 ~ 1000 $\mu$m |
| REVERSE HEIGHT | 000 ~ 800 $\mu$m |
| REVERSE ANGLE | 000 ~ 060° |
| LENGTH OF TOP SIDE | 0000 ~ 4000 $\mu$m |
| DELIVERED WIRE AMOUNT | -200 ~ +200 $\mu$m |
| CLAMPER OPEN AND CLOSE | 000 ~ 100% |

BONDING DATA SETTING DEVICE AND METHOD

BACKGROUND OF THE INVENTION

1. Field of the Invention

The present invention relates to a bonding data setting device and method and more particularly to a bonding data setting device and method which are used to set the operating parameters of the bonding tool in a wire loop formation process.

2. Prior Art

In order to obtain a desired wire loop shape in a wire bonding apparatus, it is necessary to set, prior to the performance of bonding operation, the operating parameters of the bonding tool, such as the so-called reverse height, reverse amount and amount of raising of the tool, etc., which are the working conditions of the bonding operation.

Conventionally, the setting of these operating parameters has been accomplished by repeating an operation in which the operator inputs the respective operating parameters as numerical values, after which an actual bonding operation is performed using the respective operating parameters that have been inputted, and the previously inputted numerical values of the respective operating parameters are corrected after observing the wire loop shape that is formed as a result.

However, such operations as providing appropriate numerical values for the operating parameters and correcting the operating parameters after observing the results of an actual bonding operation require skill on the part of the operator. In particular, predicting the wire loop shape that will actually be formed from the numerical values of the operating parameters is difficult for an operator who has a little experience.

SUMMARY OF THE INVENTION

Accordingly, the object of the present invention is to provide means of facilitating and increasing the efficiency of the setting of the operating parameters of a bonding tool that is used to form a wire loop into a desired shape.

The above object is accomplished by a unique structure for a bonding data setting device that sets operating parameters of a bonding tool used in wire bonding, the bonding data setting device comprising:

an image drawing means which a wire loop shape on a screen;

a handle display means which displays an editing handle on the screen;

a manipulating input means which is used to manipulate a position of the editing handle displayed on the screen;

a redrawing means which is used to redraw the displayed wire loop shape in a position that conforms to a movement of the editing handle;

a parameter calculating means which calculates values of operating parameters that conforms to the wire loop shape that is drawn or redrawn on the screen; and a parameter value display means which displays calculated values of the operating parameters on the screen.

In the present invention, when the operator manipulates the position of the editing handle using the manipulating input means, the shape of the wire loop on the screen is redrawn in a position that conforms to the movement of the editing handle. Then, the values of the operating parameters corresponding to the wire loop shape that has bee drawn or redrawn on the screen are calculated by the parameter calculating means, and the results are displayed on the screen. Accordingly, even an operator, who has no previous knowledge of the correspondence between the values of the operating parameters and the shape of the wire loop that is actually formed, can easily and efficiently set the operating parameters of the bonding tool.

Furthermore, in the present invention, the above structure of the bonding data setting device can further include: a loop shape display means which displays a plurality of different types of shape of the wire loops on the screen; and a selective input means which selects and inputs one of the displayed plurality of different types of shape of the wire loops In this structure, a plurality of different types of wire loop shapes are displayed on the screen, and one of the plurality of different types of wire loop shapes is selected and inputted by the operator using the selective input means. Accordingly, parameters corresponding to a desired shape can be read out by selecting this desired shape from the plurality of different wire loop shapes displayed on the screen. Furthermore, new bonding data can be set by utilizing existing bonding data; accordingly, the setting work can be made more efficient.

In addition, in the present invention, the above structure of the bonding data setting device can further includes: a judgement means which judges whether or not a manipulated input value of the position of the editing handle that has been inputted by the manipulating input means is within a specified permissible range; and an out-of-range output means which outputs a specified out-of-range output in cases where the manipulated input value is outside a permissible range.

In this structure, the judgement means judges whether or not the manipulated input value of the position of the editing handle that has been inputted by the manipulating input means is within a specified permissible range, and the out-of-range output means outputs a specified out-of-range output in cases where the manipulated input value is outside the permissible range. Accordingly, even an inexperienced operator can avoid setting the values of the operating parameters outside the permissible range.

In the present invention, the out-of-range output is an alteration of a display method of a redrawn image redrawn by the redrawing means, or it can be a warning.

Furthermore, in the bonding data setting device of the present invention, a parameter value input means that inputs values of the operating parameters may be further provided, and the redrawing means redraws the shape of the wire loop based upon the inputted parameter values.

In this structure, in addition to the effects of the first through fifth inventions, the wire loop shape is redrawn according to the input of the operating parameters. Accordingly, for example, in cases where there are existing operating parameters determined by dimensional restrictions, etc., on the wire loop shape given by design and dimensional conditions such as the distance in the planar direction and the direction of heights between the leads and pads on the semiconductor chip connected to each other by the wire loops, bending strength of the wire used in the wire loops and spacing of the wire loops, etc., these operating parameters can be utilized.

The above-described object is further accomplished by unique steps in a bonding data setting method of the present invention that sets operating parameters of a bonding tool in wire bonding, the method of the present invention comprising the steps of:

drawing a wire loop shape on a screen;

displaying an editing handle on the screen;

acquiring a manipulated input of a position of the editing handle displayed on the screen;

redrawing the displayed wire loop shape in a position that conforms to a movement of the editing handle;

calculating values of operating parameters that correspond to the wire loop shape that is drawn or redrawn on the screen; and displaying the calculated values of the operating parameters on the screen.

BRIEF DESCRIPTION OF THE DRAWINGS

FIG. 6 is a table that shows one example of the parameter setting ranges;

DETAILED DESCRIPTION OF THE INVENTION

Embodiments of the present invention will be described below with reference to the accompanying drawings.

Figure 1:
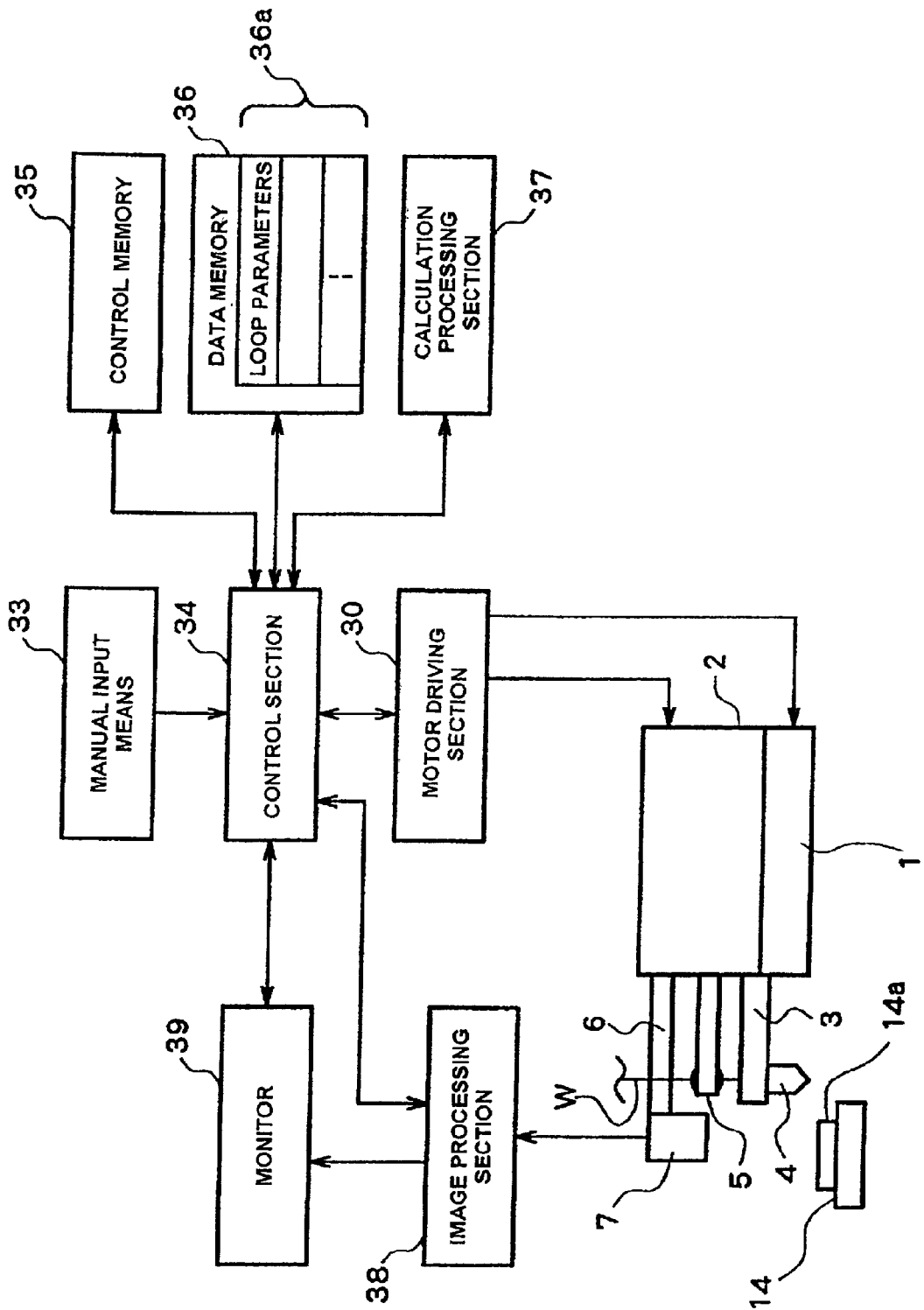
FIG. 1 is a block diagram of the schematic structure of a bonding apparatus according to an embodiment of the present invention.

FIG. 1 shows the schematic construction of a wire bonder constructed according to an embodiment of the present invention. In FIG. 1, a bonding arm 3 is disposed on a bonding head 2 that is mounted on an XY table 1, and a tool 4 is attached to the tip end portion of the bonding arm 3. The bonding arm 3 is driven in the vertical direction by a Z-axis motor (not shown). A clamper 5 that holds a wire W is disposed above the bonding arm 3. The lower end of the wire W is passed through the tool 4. The tool 4 in the present embodiment is a capillary.

A camera arm 6 is fastened to the bonding head 2, and a camera 7 is fastened to the camera arm 6. The camera 7 images a wiring board 14 on which a semiconductor chip 14a, etc., is mounted. The XY table 1 is constructed so that this table can be accurately moved in the X and Y directions which are the directions of the mutually perpendicular coordinate axes in the horizontal plane by means of XY table motors (not shown), which are, for instance, two pulse motors and installed in the vicinity of the XY table 1. The structure described so far is a known structure in prior art.

The XY table 1 is driven via a motor driving section 30 and the XY table motors by commands from a control section 34 consisting of a microprocessor, etc. The image acquired by the camera 7 is converted into an electrical signal to form image data; this image data is processed by an image processing section 38, and is inputted into a calculation processing section 37 via the control section 34. In the calculation processing section 37, various types of calculations including calculations involved in the setting of parameters (described later) are performed, and programs and data used for such calculations are temporarily held in a control memory 35.

A manual input means 33 and a monitor 39 are connected to the control section 34. The manual input means 33 is preferably a pointing device such as a mouse, etc., at least equipped with a direction indicating function for the X and Y directions and a set signal input function using an input button, and a universally known keyboard equipped with a character input function. The monitor 39 is, for instance, a CRT or liquid crystal display device. In addition to parameter setting images (described later), images acquired by the camera 7, etc. are displayed on the display screen 20 (see FIGS. 4 and 5) of this monitor 39 based upon the output of the control section 34. The monitor 39 is constructed so that in the parameter setting images, an arrow-shaped pointer 40 which is displayed on the display screen 20 moves in linkage with the operation of the manual input means 33.

A loop library 36a in which various types of existing data concerning loops and past setting data are stored in association with oath other is accommodated in the data memory 36. The existing data contained in the loop library 36a includes: line drawing data depicting a plurality of different types of wire loop models that correspond to various modes (see FIG. 4) of individual types in which the loop shape is classified according to inclination; data concerning default values for various types of operating parameters in the respective modes, the number of editing handles 45 in the respective modes (see FIG. 5); and operating ranges of the respective editing handles 45, etc. These existing data construct respective sets of data files in which the line drawing data, data concerning the default values of the various types of operating parameters, and data concerning the number of the editing handles and the operating ranges of the editing handles 45, etc. are accommodated in association with each other for each single loop consisting of a single wire connecting a certain two bonding points. The number of editing handles 45 is one or more for each single loop.

Figure 4:
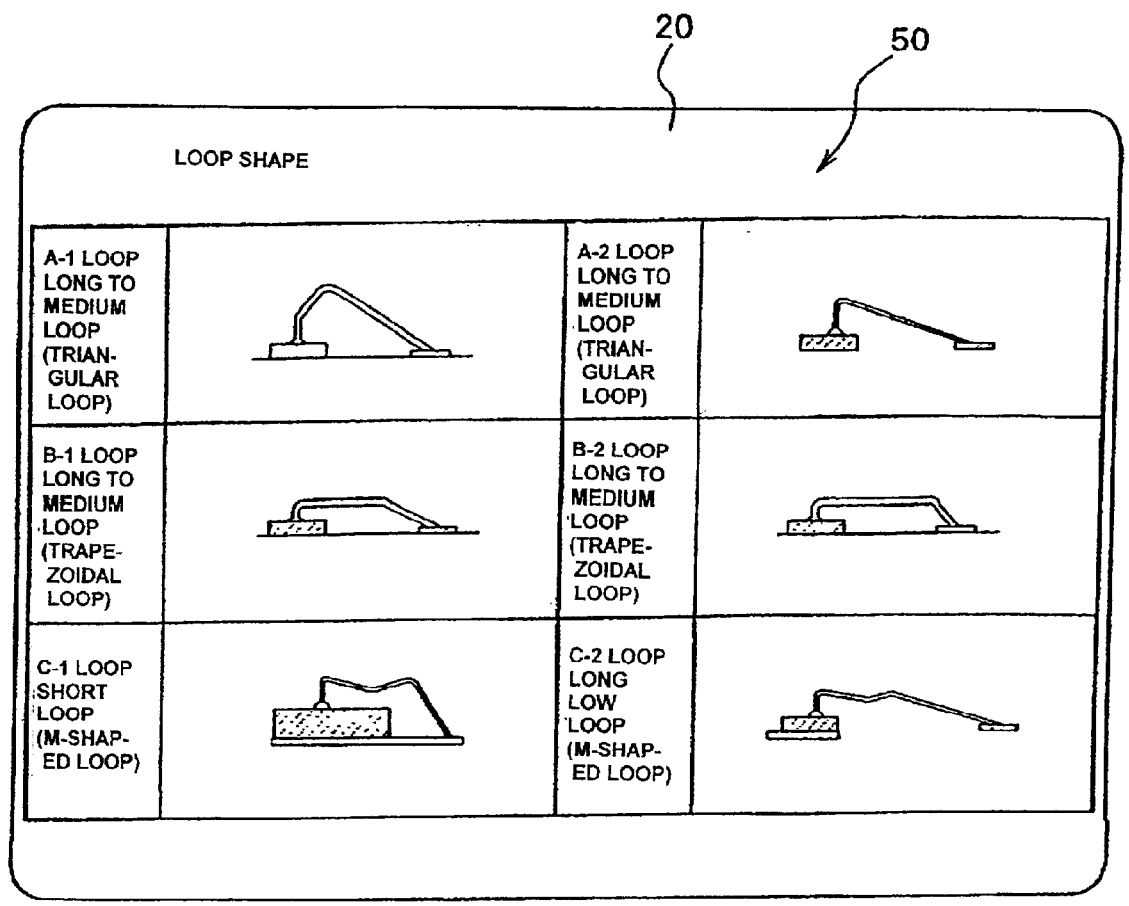
FIG. 4 is a diagram that shows an example of the display on the display screen of the monitor, displaying the loop shape list.
Figure 5:
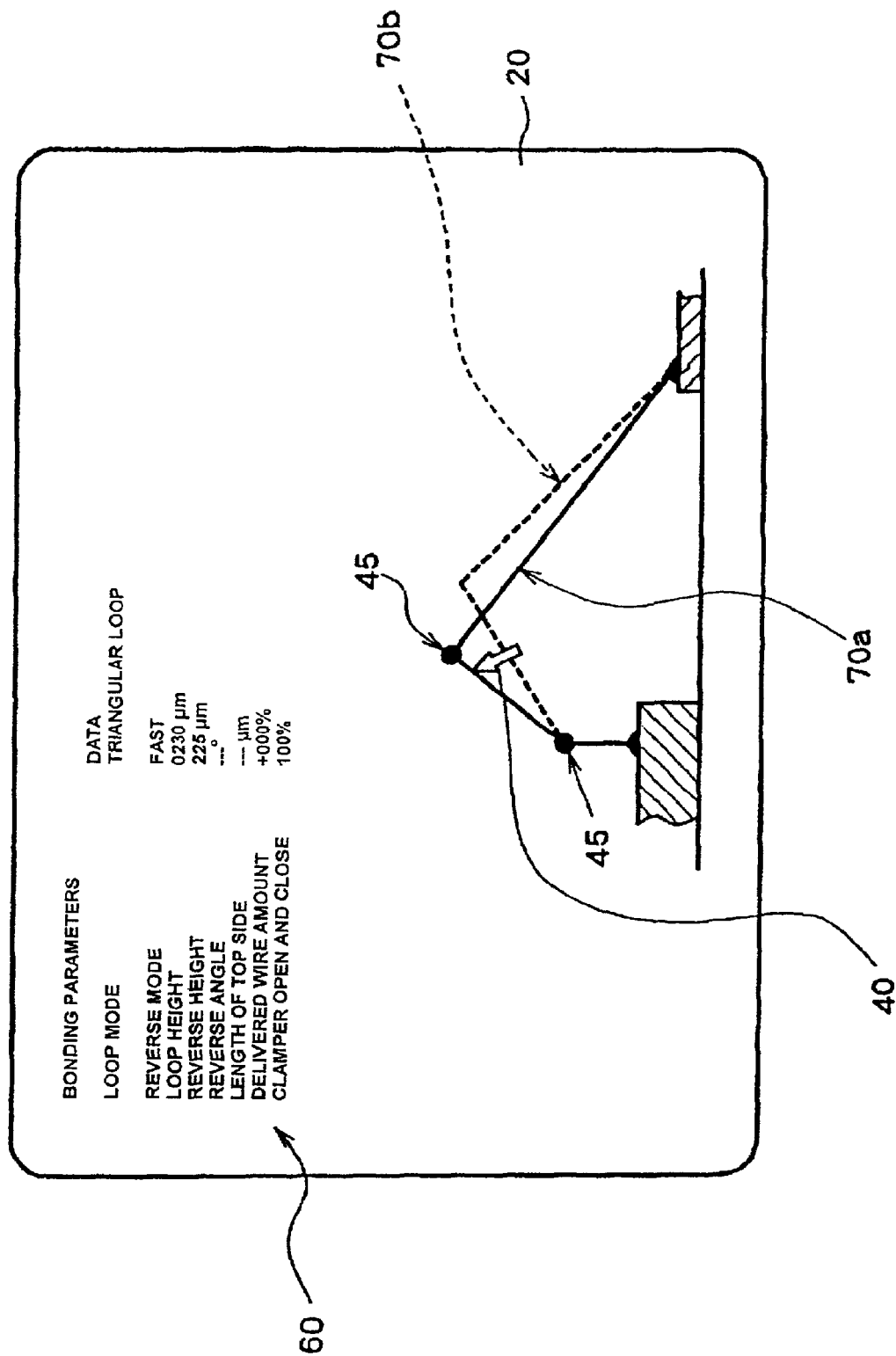
FIG. 5 is an explanatory diagram that shows an example of the display on the display screen of the monitor, displaying the parameter setting screen.

The respective operating parameter names and parameter values, and line drawings of the selected wire loops, are displayed on the display screen 20 (see FIGS. 4 and 5).

As shown in FIG. 4, examples of loop shapes that can be selected include "A-1" (standard triangular loop), "A-2" (triangular loop which shifts directly to an inclined side from the vertical side), "B-1" (trapezoidal loop used in cases where the distance between the pad and lead is long), "B-2" (trapezoidal loop with a long upper side), "C-1" (M-shaped loop used in cases where the distance between the pad and lead is short), and "C-2" (M-shaped loop used in cases where the distance between the pad and lead is long). In the present embodiment, "A-1" is selected as the default loop shape among these loop shapes.

The loop shapes that can be selected are displayed as a loop shape list 50 on the display screen 20 as shown in FIG. 4. An operator can select the desired type of loop shape by selecting and inputting a line drawing of one of the loop shapes or characters using the manual input means 33.

The selection and input of such a line drawing or characters are accomplished, for example, as follows: the operator superimposes a pointer 40 by means of a pointing device such as a mouse input device (which constitutes the manual input means 33) on an arbitrary portion of the region of the display screen 20 corresponding to one of the line drawings or set of characters among the line drawings depicting a plurality of different types of wire loop models in the loop shape list 50 or characters displayed adjacent to these line drawings so that the characters correspond to the line drawings; then the operator presses the input button (below, such a movement of the pointer 40 on the display screen 20 that generates an action will be referred to as "clicking").

It is also possible to use a structure in which a line drawing or characters are selected by aligning a cursor (a mark which indicates positions on the screen that can be designated and inputted by the operator by means of the flashing of a graphic shape such as a rectangle, etc.) with this line drawing or characters by operating a keyboard used as the manual input means 33, and for example, pressing an execute button.

Figure 8:
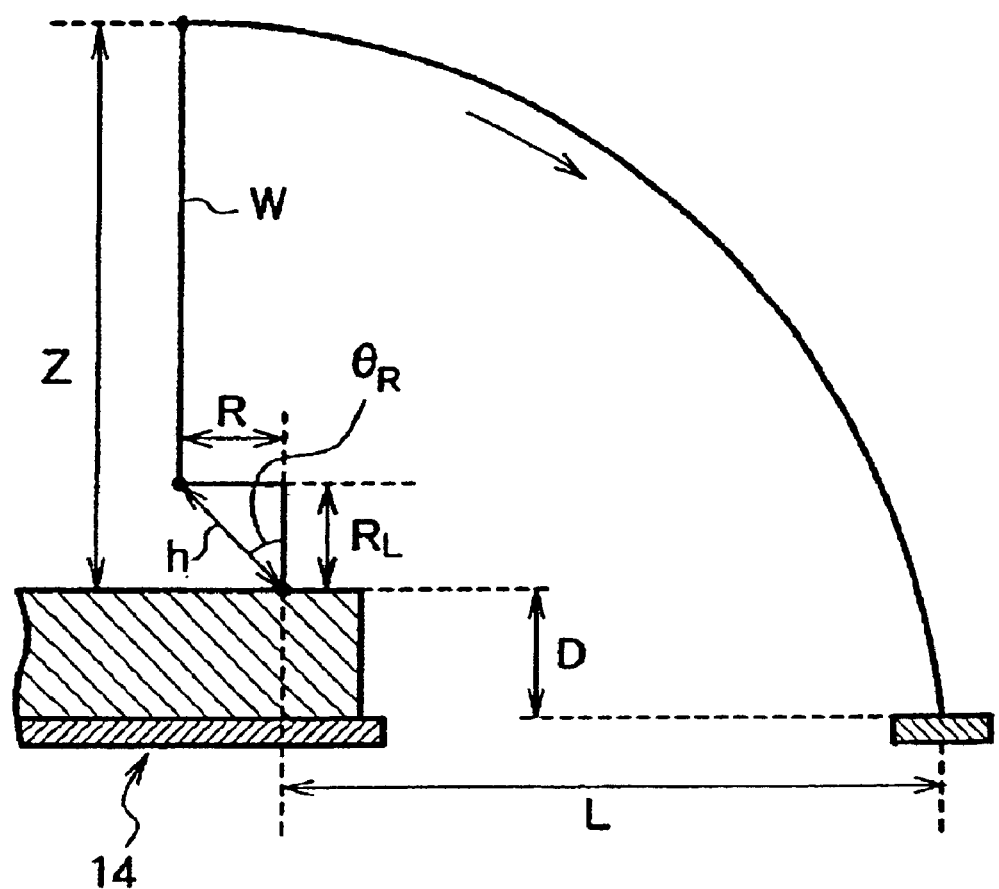
FIG. 8 is an explanatory diagram which illustrates the wire bonding process.
Figure 9A:
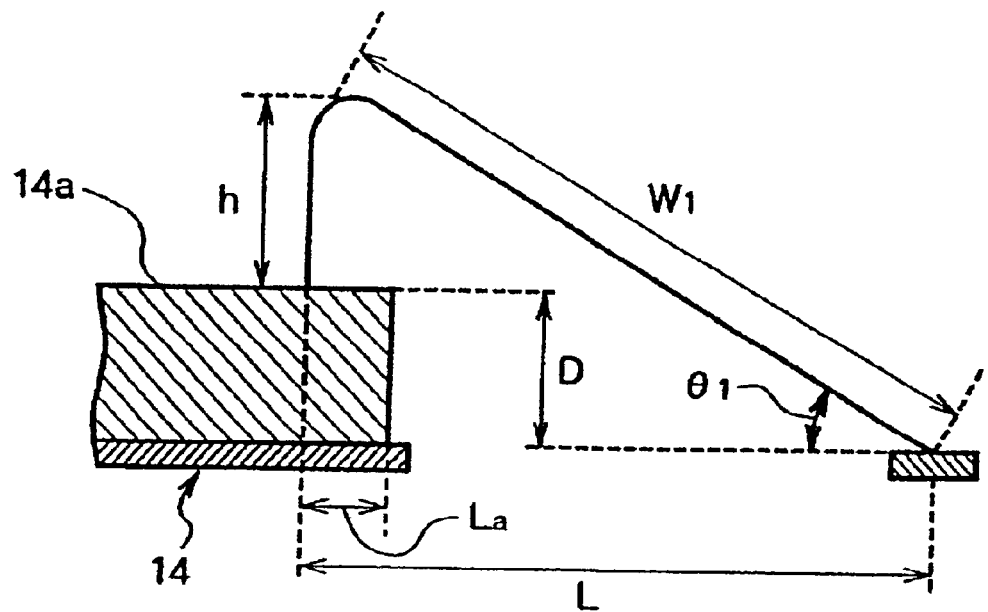
FIG. 9A is an explanatory diagram that shows wire loop shape of a triangular wire.
Figure 9B:
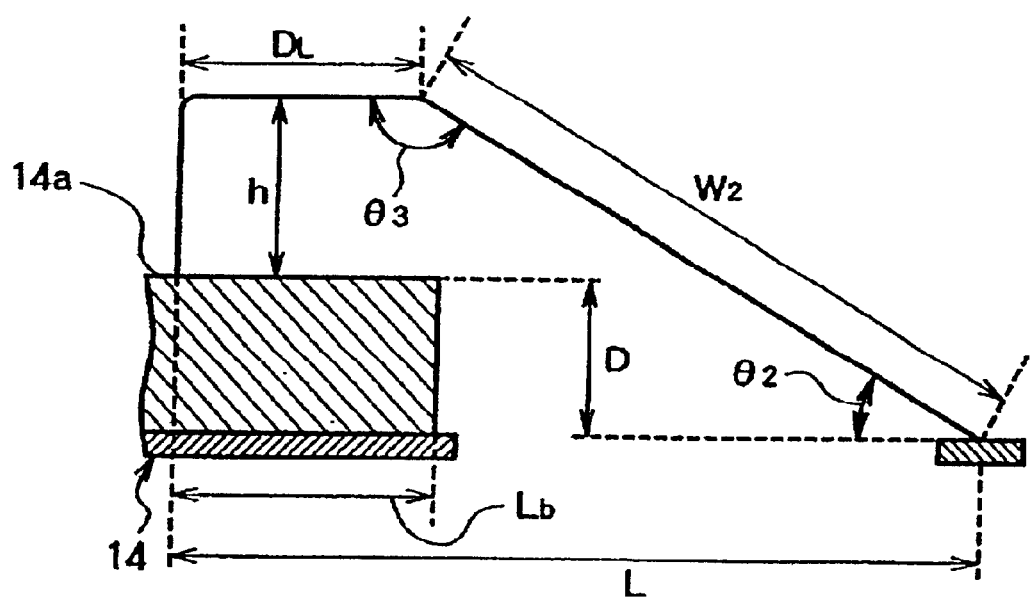
FIG. 9B is an explanatory diagram which shows wire loop shape of a trapezoidal wire.

The parameters that are set include the various parameters indicated in the parameter list 60 shown in FIG. 5. The values that can be adopted by the various parameters are, for example, as shown in FIG. 6. Values that differ are determined according to the type of loop shape selected by the selection of line drawings or characters. Furthermore, "reverse mode" refers to the speed of the reverse operation of the tool 4; NO in FIG. 6 indicates "does not reverse", SLOW indicates "slow", and FAST indicates "fast". "Loop height" indicates the dimension of the portion indicated by the symbol h in FIGS. 9A and 9B, and "reverse height" indicates the dimension of the portion indicated by the symbol RL in FIG. 8 (dimension for which the reverse operation is performed in the vertical direction). Also, "reverse angle" indicates the angle of the portion indicated by the symbol θR in FIG. 8 (the angle of the reverse operation), and "length of upper side" indicates the dimension of the portion indicated by the symbol DL in FIG. 9B (length of the upper side in a trapezoidal loop). Furthermore, "delivered wire amount" indicates the length of the wire W delivered in the bonding operation, and "clamper open and close" indicates the timing of the opening and closing of the clamper 5.

Figure 7A:
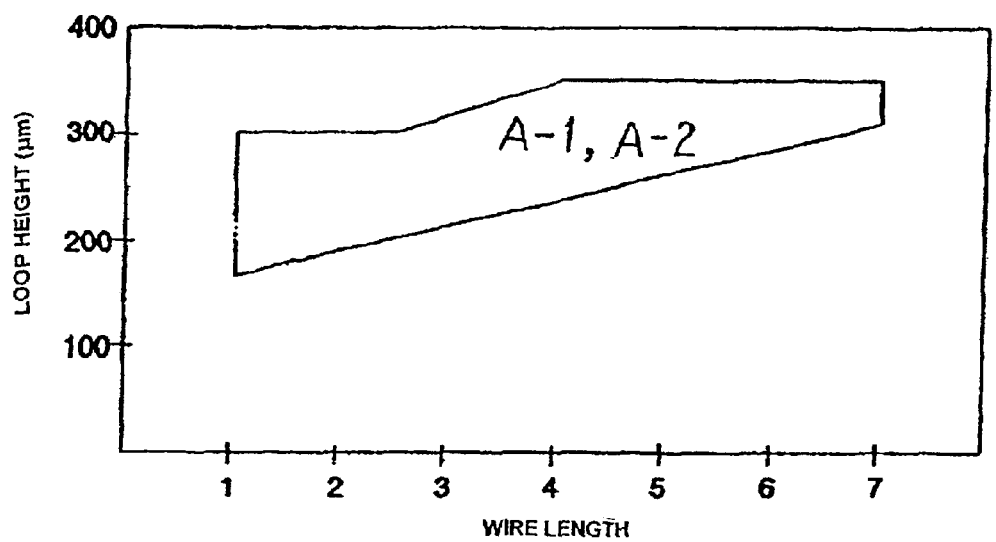
FIGS. 7A and 7B are graphs that show the permissible values of the loop height and wire length in various modes.
Figure 7B:
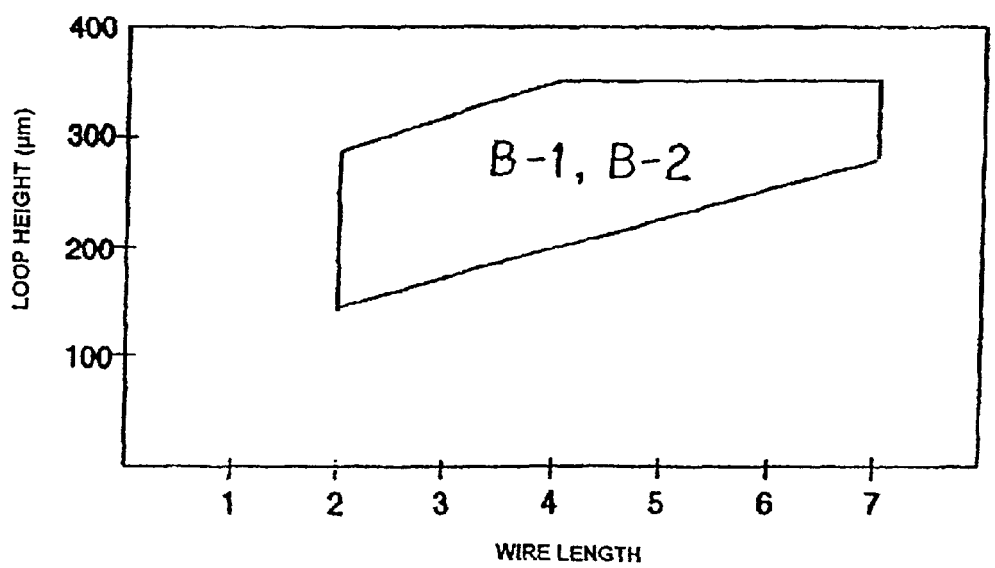

Furthermore, for the operating ranges of the respective editing handles 45 described above, values that correspond to the ranges of the loop heights and wire lengths that can be adopted by the loop shapes of the various modes are set (see FIGS. 7A and 7B).

Figure 2:
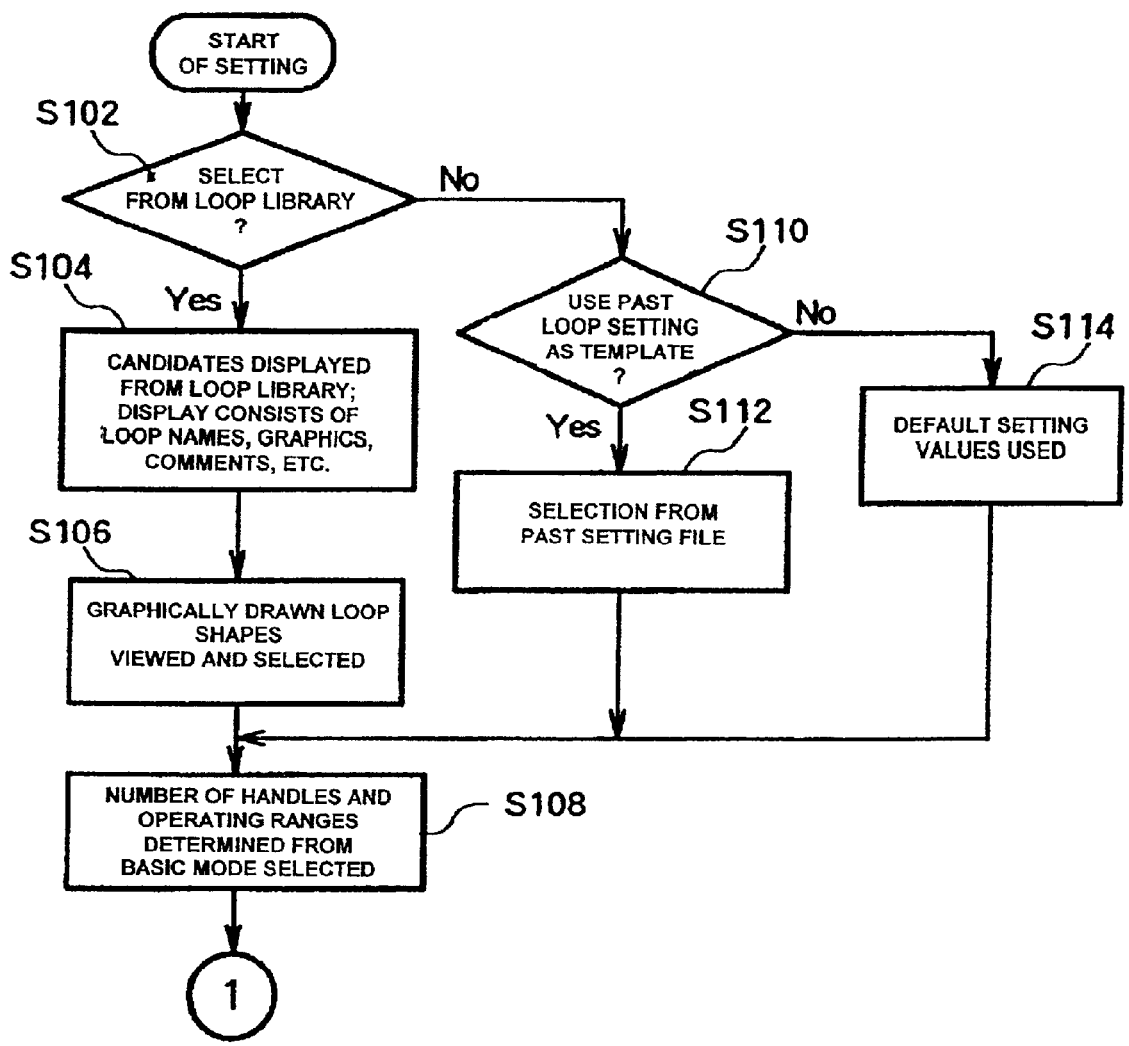
FIG. 2 is a flow chart of one example of the parameter setting processing in this embodiment.
Figure 3:
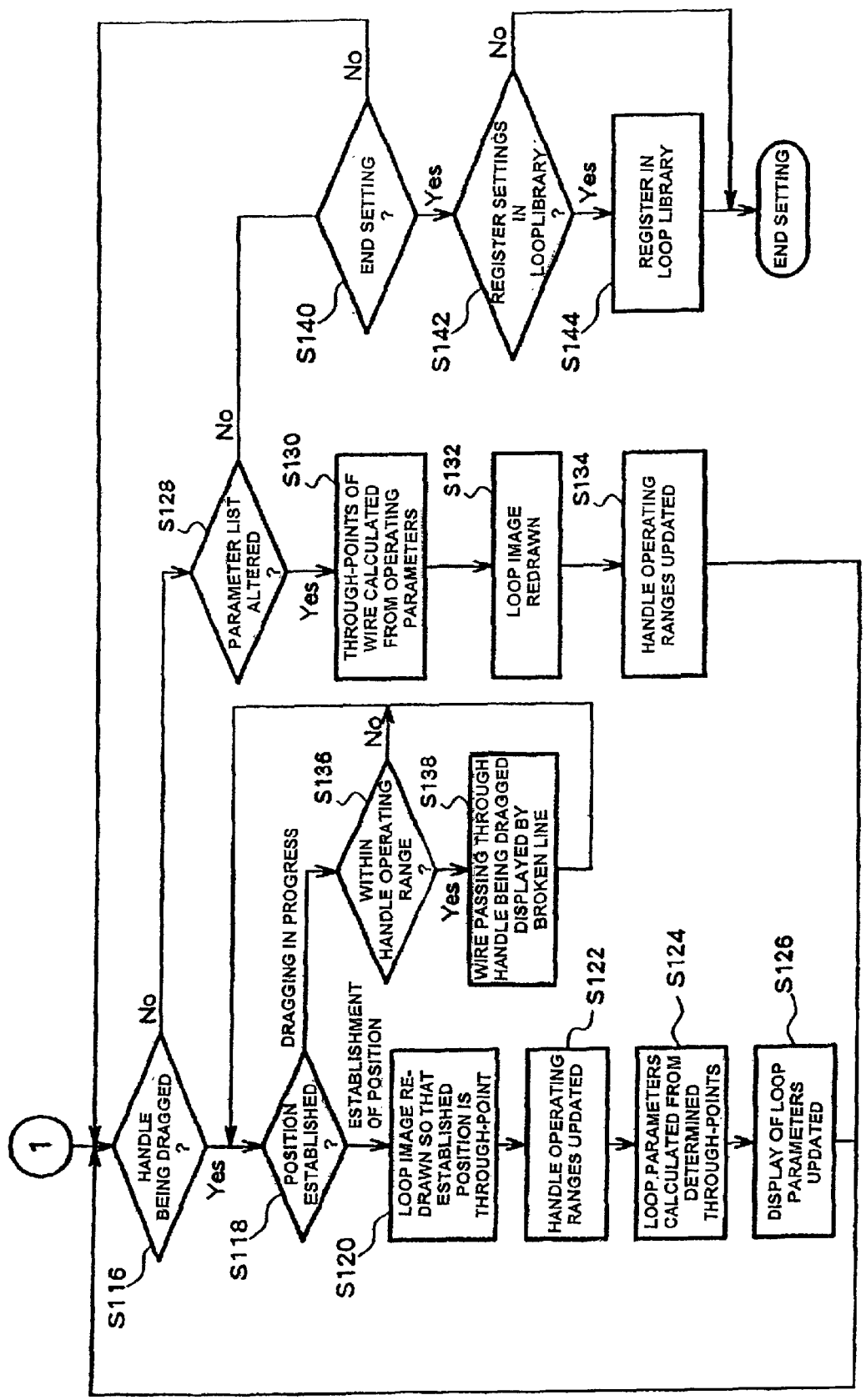
FIG. 3 is a flow chart continuous from the flow chart of FIG. 2.

Next, the operation in the setting mode (setting input operating state) of the present embodiment will be described according to the flow charts in FIGS. 2 and 3.

First, an input request of "select loop setting from loop library?", and respective buttons of "select" and "no selection" are displayed on the display screen 20 (S102). In cases where the operator makes a designation by clicking on the "select" button, the loop shape list 50 shown in FIG. 4 is next displayed (S104). The operator selects the desired loop shape by using, for instance, a mouse input device (called "mouse") to designate a line drawing or characters for one of the loop shapes (S106).

In cases where the operator designates "no selection" in step S102, an input request of "use past loop setting as template?" is next displayed on the display screen 20. In cases where the operator designates "use", a list of past setting data (not shown) is displayed, and the operator selects desired setting data from past setting data in the same manner as in the case of existing data (S112). In cases where the operator designates "do not use", "A-1" is selected as the default loop shape (S114).

When an existing loop setting or past loop setting is selected as a result of the above operation, reference is made to the loop library 36*a* of the data memory 36 in accordance with this selection, respective parameter values corresponding to the setting of the selected loop are read out, and the loop shape corresponding to these parameter values is drawn as a line drawing (wire frame model). Furthermore, the number of editing handles 45 in the selected loop setting and the operating ranges of the respective editing handles are read out (S108). The respective data thus read out are displayed on the display screen 20 as the parameter list 60 shown in FIG. 5, and are drawn and displayed as a loop line drawing 70*a*. The positions of the tip ends of the respective leg portions in the loop line drawing 70*a* (i.e., the positions in the loop line drawing 70*a* corresponding to the points where the wire corresponding to the loop line drawing 70*a* are bonded) are considered to be fixed.

Next, a judgement is made as to whether or not the operator has dragged the editing handles 45, i.e., as to whether or not a movement-manipulation input of the editing handles 45 on the screen has been inputted by utilizing the manual input means 33 and pointer 40 (S116). In cases where such dragging has been performed, a judgement is made as to whether or not the dragging has ended so that the positions of the editing handles 45 are confirmed (S118). This dragging operation is accomplished in the following manner: with the pointer 40 being aligned with an editing handle 45, the input switch of the mouse, which is the manual input means 33, is pressed; and the mouse is moved in this state, so that the editing handle 45 is virtually "grasped" on the screen by the pointer 40 (i.e., in a state in which the position of the editing handle 45 relative to the pointer 40 is fixed at the relative position that is shown at the time that the input switch is pressed, the editing handle 45 is held so that the position of the pointer 40 within the display screen 20, and therefore the position of the editing handle 45 within the display screen 20, can be moved) and is then caused to move. In FIG. 3, the editing handles are noted simply as "handles".

In cases where the positions are confirmed, the line drawing indicating the wire loop is next redrawn so that the confirmed positions are points through which the line passes (S120). In other words, the loop line drawing 70*a* that is previously drawn and displayed is erased, and a loop line drawing 70*b* is newly displayed in the newly confirmed position.

Next, the operating ranges of the editing handles 45 are updated based upon the newly confirmed loop shape (S122).

Then, on the basis of the track of the newly confirmed loop shape, the operating parameters of the tool 4 required for the actual production of this loop shape are calculated (S124), and the respective operating parameters in the parameter list 60 are updated (S126).

In the case of a NO in step S116, i.e., in cases where the editing handles 45 is not being dragged, a judgement is made as to whether or not there has been an altered input of the respective operating parameters into the parameter list 60 (S128). In cases where there has been an alteration, i.e., in cases where at least one parameter value has been altered by the manual input of parameter values into the parameter list 60 by the operator using the manual input means 33, the track of the wire W actually produced by these operating parameters is calculated based upon the altered operating parameters (S130), and the loop line drawing (e.g., the loop line drawing 70*b*) is redrawn based upon this calculated track. Then, the operating ranges of the editing handles 45 are updated based upon the newly established loop shape (S134).

In the case of a NO in step S118, i.e., in cases where dragging is still being performed and the positions of the editing handles 45 have not been established, a judgement is made as to whether or not the current positions of the editing handles 45 are within the operating ranges of these editing handles 45 (S136). In cases where the positions are within the operating ranges, the wire shape passing through the editing handles 45 that are being dragged is displayed by a broken line (S138). On the other hand, in cases where dragging is still being performed and the positions of the editing handles 45 are outside the operating ranges, a broke-line display of the wire shape is not performed in step S138. The positions of the editing handles 45 are established by ending the dragging operation (e.g., in the case of a mouse, by releasing the input button from the dragging state).

In the case of a NO in step S128, i.e., in cases where there has been no altered input of the respective operating parameters into the parameter list 60, an input request of "end setting?" and respective buttons of "end" and "do not end" are displayed (S140). In cases where the operator designates "end", an input request of "register settings in loop library?" and respective buttons of "register" and "do not register" are displayed next (S142). In cases where the operator selects "register", the respective parameter values at that point in time are stored and registered as a new data file in the loop library 36a of the data memory 36 (S144). In cases where the operator selects "do not register", this routine is ended.

In the above embodiment, as described above, when the positions of the editing handles 45 are manipulated by the operator using the manual input means 33, the shape indicated by the loop line drawing 70a displayed on the display screen 20 is redrawn as a loop line drawing 70b in a position that conforms to the movement of the editing handles 45. Then, the values of the operating parameters corresponding to the loop shape indicated by the shape of the drawn or redrawn loop line drawing 70a or 70b are calculated (S124), and the results are displayed on the display screen 20. Accordingly, even an operator who has no previous knowledge of the correspondence between the values of the operating parameters and the wire loop shape that is actually formed can set the operating parameters of the tool 4 easily and efficiently.

Furthermore, in the above embodiment, a plurality of different types of wire loop shapes are displayed on the display screen 20 in the form of line drawings (FIG. 4), and the operator selects and inputs one of the plurality of different types of wire loop shapes indicated by these line drawings. Accordingly, by selecting the desired shape from the plurality of different types of wire loop shapes indicated by the line drawings displayed on the display screen 20, the parameters corresponding to this shape can be read out, and new bonding data can be set using existing bonding data. Consequently, the setting work can be made more efficient.

Also, in the shown embodiment, a judgement is made as to whether or not the manipulated input values of the positions of the editing handles 45 inputted by the manual input means 33 are within the operating ranges of such values (S136), and redrawing (S138) is not performed in cases where these values are outside the operating ranges. Accordingly, even an operator with a little experience can avoid setting the values of the operating parameters outside the permissible ranges.

Furthermore, in the above-described embodiment, the parameter values are varied and displayed by dragging the loop line drawings 70a; and conversely, the loop line drawings 70a are redrawn by altering the parameter values in the parameter list 60 (S128–S134). Accordingly, when there are known operating parameters determined by dimensional restrictions, etc. on the wire loop shape given by design and dimensional conditions such as the distance in the planar direction or direction of height between the lead and pad on the semiconductor chip that are connected to each other by the wire loop, the bending strength of the wire used in the wire loop, and the spacing of the wire loops, etc., these parameters can be utilized. Furthermore, since the loop line drawings 70a and parameter values are always linked, the operability is good.

In addition, in the above-described embodiment, redrawing (S138) is not performed when the manipulated input values of the positions of the editing handles 45 inputted by the manual input means 33 are outside the operating ranges. Instead, it is also possible to use a structure in which, for instance, the loop line drawings 70a are displayed by black solid lines under ordinary conditions, and are redrawn using a display configuration that differs from the ordinary display configuration (such as a display using red broken lines, etc.) in cases where the values are outside the operating ranges. Furthermore, instead of above structures or in addition to such structures, it is also possible to prevent erroneous setting of the values of the operating parameters by outputting a warning such as an audio output using a buzzer or a warning message (e.g., a character display such as "outside allowed setting range", etc.) to the display screen 20.

In the described embodiment, the shapes of loops are displayed by line drawings in the loop shape list 50. However, it is also possible to display the shapes of a plurality of different types of wire loops by means of characters alone in the present invention; and such a structure is also in the scope of the present invention.

What is claimed is:

1. A bonding data setting device for setting wire loop shape parameters for a bonding tool of a wire bonding apparatus, said bonding data setting device comprising:

an image drawing means which draws a wire loop shape on a screen;

a handle display means which displays an editing handle on said screen;

a manipulating input means which is used to manipulate a position of said editing handle displayed on said screen;

a redrawing means which is used to redraw said displayed wire loop shape in a position that conforms to a movement of said editing handle;

a parameter calculating means which calculates values of operating parameters that correspond to said wire loop shape that is drawn or redrawn on said screen;

a parameter value display means which displays calculated values of said operating parameters on said screen;

a loop shape display means which displays a plurality of different types of shape of said wire loops on said screen;

a selective input means which selects and inputs one of displayed plurality of different types of shape of said wire loops;

a judgment means which judges whether or not a manipulated input value of said position of said editing handle that has been inputted by said manipulating input means is within a specified permissible range; and an out-of-range output means which outputs a specified out-of-range output in cases where said manipulated input value is outside said permissible range.

2. The bonding data setting device according to claim 1, wherein said out-of-range output is an alteration of a display method of a redrawn image redrawn by said redrawing means.

3. The bonding data setting device according to claim 2, wherein a parameter value input means that inputs values of said operating parameters is further provided; and said redrawing means redraws said shape of said wire loop based upon inputted parameter values.

4. The bonding data setting device according to claim 1, wherein said out-of-range output is a warning.

5. The bonding data setting device according to claim 4, wherein a parameter value input means that inputs values of said operating parameters is further provided; and said redrawing means redraws a shape of said wire loop based upon inputted parameter values.

6. The bonding data setting device according to claim 1, wherein a parameter value input means that inputs values of said operating parameters is further provided; and said redrawing means redraws a shape of said wire loop based upon inputted parameter values.

7. The bonding data setting device according to claim 1, wherein a parameter value input means that inputs values of said operating parameters is further provided, and said redrawing means redraws a shape of said wire loop based upon inputted parameter values.

8. A bonding data setting method for setting wire loop shape parameters for a bonding tool of a wire bonding apparatus, said bonding data setting method comprising the steps of:

drawing a wire loop shape on a screen;

displaying an editing handle on said screen;

acquiring a manipulated input of a position of said editing handle displayed on said screen;

redrawing said displayed wire loop shape in a position that conforms to a movement of said editing handle;

calculating values of operating parameters that correspond to said wire loop shape that is drawn redrawn on said screen; and displaying calculated values of said operating parameters on said screen.

* * * * *